United States Patent [19]

Negm et al.

[11] Patent Number: 5,296,459

[45] Date of Patent: Mar. 22, 1994

[54] METHOD FOR MAKING AN ELECTRICALLY CONDUCTIVE CONTACT FOR JOINING HIGH $T_c$ SUPERCONDUCTORS

[75] Inventors: Yehia Negm, Braintree; George O. Zimmerman, South Hamilton, both of Mass.; Randy J. McConeghy, Waxahachie, Tex.

[73] Assignee: Trustees of Boston University, Boston, Mass.

[21] Appl. No.: 902,224

[22] Filed: Jun. 19, 1992

[51] Int. Cl.$^5$ .................... H01L 39/12; B05D 5/12
[52] U.S. Cl. .................... 505/1; 505/706; 427/62; 427/123; 427/405
[58] Field of Search ........... 505/1, 706; 427/62, 427/63, 405, 123; 428/930, 632, 672, 673

[56] References Cited

U.S. PATENT DOCUMENTS 5,147,849  9/1992  Tanaka et al. .................... 505/1

OTHER PUBLICATIONS

Chen et al, "Heat treatment effect on the metal contact of high-Tc (lead, bismuth) strontium calcium copper oxide superconductor", Jpn. J. Appl. Phys., Part 1, 30(1), Jan. 1991, pp. 33-37.

*Primary Examiner*—Roy King
*Attorney, Agent, or Firm*—David Prashker

[57] ABSTRACT

The present invention provides a methodology for forming an electrically conductive contact on the external surface of superconductive materials. The methodology is employed using any Noble metal to form the conductive contact; and is used with any superconductive material conventionally known. The resulting conductive contact provides a low electrical resistance and firm point of electrical junction for the superconductor with any conductive material in any electrical circuit or use.

3 Claims, 2 Drawing Sheets

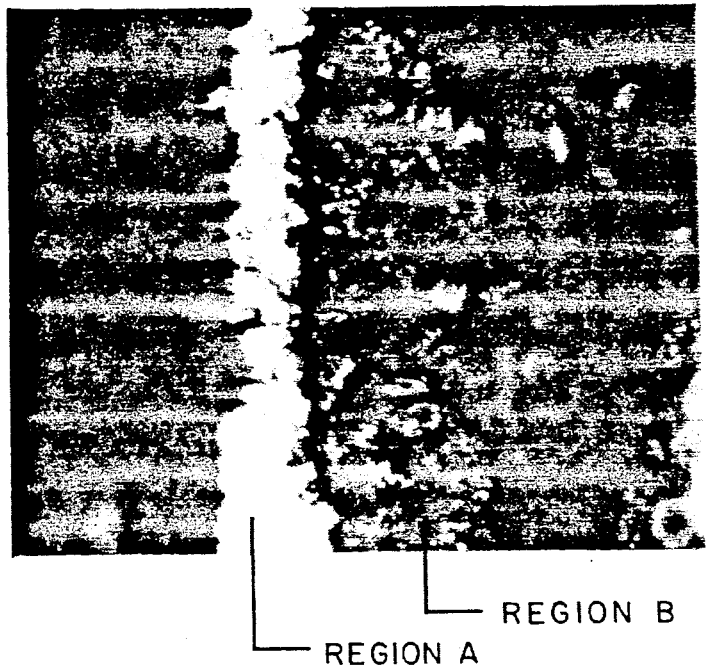
FIG. 1 — REGION A, REGION B
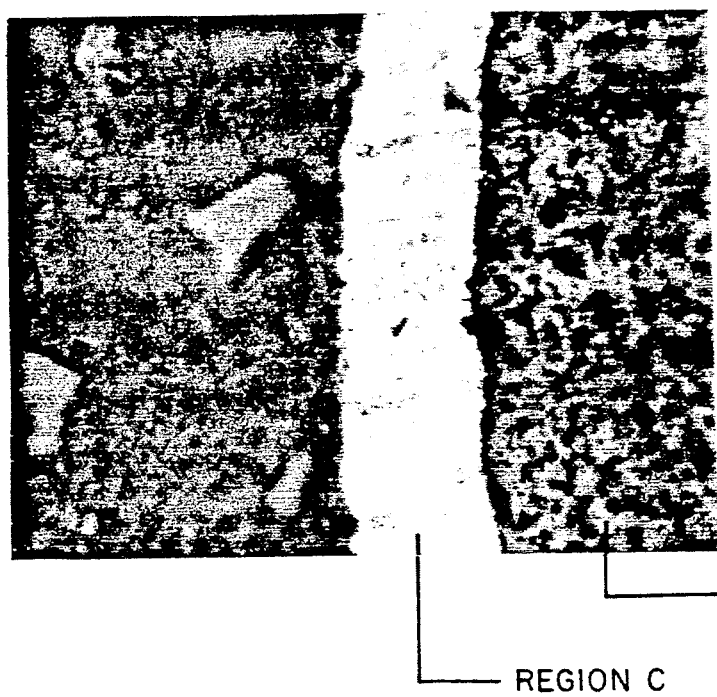
FIG. 2 — REGION C, REGION D

METHOD FOR MAKING AN ELECTRICALLY CONDUCTIVE CONTACT FOR JOINING HIGH $T_c$ SUPERCONDUCTORS

FIELD OF THE INVENTION

The present invention is concerned with conductive unions which electrically join conductive metals and/or ceramics together at temperatures between about 75-80 K. and 4.5 K.; and is particularly directed to methods for making conductive contacts which provide minimal electrical interface resistance and heat generation when employed electrically to join superconductors to themselves, to normal conductors, or to semi-conductors.

BACKGROUND OF THE INVENTION

Superconductivity was first observed by the Dutch physicist H. K. Onnes in 1911 during his investigations of the electrical conductivities of metals at very low temperatures. He observed that as purified mercury is cooled, its electrical resistivity vanishes abruptly at a temperature of 4.16 K. Above this temperature, the electrical resistivity is small but finite and measurable; alternatively, when the temperature is reduced below 4.16 K., the electrical resistivity is so small that it is effectively zero. This distinct temperature at which the transition and loss of effective electrical resistivity occurs has been termed the critical temperature or "$T_c$". Onnes believed he had discovered a new physical state of matter at temperatures below the critical temperature and coined the term "superconducting state" for the observed phenomenon at temperatures below the critical temperature ($T_c$) and the term "normal state" for the electrical properties observed at temperatures above the critical temperature. Onnes also found that the superconducting transition is reversible and that the superconducting material recovered its normal, electrical resistivity at the critical temperature.

The modern theory of superconductivity is the result of the research investigations by Bardeen, Cooper, and Schrieffer [*Phys. Rev.* 106:162 (1957)]. Their proposal, conventionally known as the "BCS theory", has now gained universal acceptance because it has proved capable of explaining most of the observed phenomena relating to superconductivity. Their principles employ a quantum mechanical treatment of the superconductive phenomenon; and their theory has been employed to explain the various observable effects such as zero electrical resistance, the Meissner effect, and the like. Since the BCS theory is so steeped in quantum mechanics, the reader is directed to published texts in the scientific literature for a complete description and explanation. These include: M. A. Omar, *Elementary Solid State Physics: Principles and Applications*, Addison-Wesley Publishing Company, 1975, pages 496-527; M. Tinkham, *Introduction to Superconductivity*, McGraw-Hill Co., 1975.

Superconductivity has been found not to be a rare phenomenon. It is exhibited by a substantial number of atomic elements, metallic alloys, and most recently, refractory oxide ceramics. For many years, the highest known critical temperature was only 23 K. There has, accordingly, been intense interest and research investigations into finding superconductive materials with much higher critical temperatures, most desirably those which hopefully would approach room temperature (20° C.). Until relatively recently, efforts to achieve this goal have met with complete failure. Beginning about 1986, however, polycrystalline scintered ceramic pellets of yttrium-barium-copper oxide and mixtures of potassium, barium, bismuth, and oxygen without copper have been found to demonstrate relatively high critical temperatures ($T_c$) and superconductivity at temperatures up to 120 K. [Bednorz, J. G. and K. A. Muller, *Z. Phys.* B64:189 (1986); Wu et al., *Phys. Rev. Lett.* 58:905 (1987); and Chu et al., *Phys. Rev. Lett.* 60:941 (1988)]. These compounds are now conventionally termed high transition temperature or "high $T_c$" superconductors.

Thus, since about 1986, the interest in superconductive materials as potential replacements for conventionally known metal alloy wiring and microcircuitry has risen appreciably; and the search for ever-higher $T_c$ superconductors in various formats is presently an area of intense exploration. Merely representative of these continuing research investigations and recently reported developments are the following publications: *Experimental Techniques in Condensed Matter Physics at Low Temperatures*, (R. C. Richardson and E. N. Smith, editors), Addison Wesley Inc., 1988, pages 118-123; G. K. White, *Experimental Techniques in Low-Temperature Physics*, Oxford University Press, 1959, pages 295-298; *Advances in Superconductivity*, Proceedings of the 1st International Symposium on Superconductivity, August 1988, Nagoya, Japan; Yeh et al., *Phys. Rev.* B36:2414 (1987); Morelli et al., *Phys. Rev.* B36:3917 (1987); Chaudhari et al., *Phys. Rev.* B36:8903 (1987); Tachikawa et al., *Proc. IEEE* 77:1124 (1989); Tabuchi et al., *Appl. Phys. Lett.* 53:606 (1989); Sacchi et al., *Appl. Phys. Lett.* 53:1111 (1988); Abell et al., *Physica* C162-164:1265 (1989); Bailey et al., *Physica* C167:133 (1990); Xiao et al., *Phys. Rev.* B36:2382 (1987); Matsuda et al., *Mat. Res. Soc. Symp. Proc.* 99:695 (1988); Witanachchi et al., *J. Mater. Res.* 5:717 (1990); *Superconductive Industry*, Winter, 1989, page 31; *Engineer's Guide to High-Temperature Superconductivity*, Wiley & Sons, Inc., 1989; and D. Newman, *Superconductive Industry* 3:16 (1990).

A concomitant and continuing problem has also arisen regarding the electrical joining and union of superconductive materials, particularly the juncture of high $T_c$ superconductors to each other and to other electrically conductive materials in the normal state at temperatures between 70 K. and 300 K. to conventional superconductive materials which have a transition temperature below 30 K. By definition, electrically conductive materials in the normal state include both the normal conductors such as gold, silver, copper, and iron; and the semi-conductors such as carbon, silicon, gray tin, and germanium; as well as their respective mixtures with indium, gallium, antimony, and arsenic. It is also difficult to make effective low resistance juncture and electrical union with the atomic elements and alloys most frequently used in practical superconducting applications. These typically are the conventionally known superconductors Nb, NbTi, and NbSn; and they frequently serve as materials used to make superconducting motors, generators, and magnets which operate at liquid helium temperature (4.5 K.).

Traditionally, solders—a general term for alloys useful for joining metals together by the process of soldering—have been used directly as an intermediate to join superconductors to themselves, to semi-conductors, and to normal conductors. The principal types of solder conventionally known are: soft solders such as lead-tin alloys; and brazing solders such as alloys of copper and zinc and sometimes silver. Representative of conventionally known solders and soldering techniques are U.S. Pat. No. 3,600,144 describing a low melting point brazing alloy; U.S. Pat. No. 4,050,956 describing a method of chemically bonding metals to refractory oxide ceramics; U.S. Pat. No. 4,580,714 disclosing a hard solder alloy comprising copper, titanium, aluminum, and vanadium; U.S. Pat. No. 4,582,240 revealing a method for intermetallic diffusion bonding of piezoelectric components; U.S. Pat. No. 4,621,761 identifying a brazing process for forming strong joints between metals and ceramics while limiting the brazing temperature to not more than 750° C.; and U.S. Pat. No. 4,631,099 describing a method for adhesion of oxide type ceramics and copper or a copper alloy. Unfortunately, solders alone and the conventionally known soldering techniques have proven inadequate for junctures of high $T_c$ superconductors.

Recently, many investigators have attempted to refine specialized techniques for lowering the resistance of electrical contacts between two high $T_c$ superconductive materials or between high $T_c$ superconductors and a metal. These techniques have included: vapor deposition of silver followed by annealing bulk sintered samples of yttrium-barium-copper oxide at temperatures up to 500 C. for an hour [*Superconductor News*, May-June, 1988, page 5]; the use of laser energy to deposit a thin film of superconductive yttrium-barium-copper oxide directly onto a silicon substrate [*Superconductor News*, May-June, 1988, page 1]; electrolytic depositing of gold onto superconducting particles [U.S. Pat. No. 4,971,944]; sputter depositing a layer of silver on a yttrium-barium-copper oxide surface [Eikin et al., *Appl. Phys. Lett.* 52 (1988)]; U.S. Pat. No. 4,963,523]; deposition of silver or gold on a superconductive material [Van der Mass et al., *Nature* 328:603 (1987)]; thermal evaporation of silver on a yttrium-barium-copper oxide surface [Tzeng et al., *Appl. Phys. Lett.* 52 (1988)]; the use of silver paste on superconductive materials [Munakata et al., *Jap. J. Appl. Phys.* 26: (1987)]; the pressing of platinum against YBCO [Grader, G. S., *App. Phys. Lett.* 51: (1987)]; and spark bonding [Lye et al., *Jap. J. App. Phys.* 27: (1988)].

There are a number of major problems within these reported methods and techniques: each requires the extensive use of vacuum deposition equipment; each limits the uses and applications by the size of the required equipment; and each requires multiple annealings of the superconductive material as a concomitant part. Moreover, many of these methods or techniques generate a high electrical resistance; and many of the electrical contacts cannot be recycled or reused because they typically become detached from the superconductor over time.

Clearly, therefore, there remains a well recognized need for effective means and methodology by which to join conductors which are electrically functional at temperatures between 300 K. to 70 K. to those conductors which become electrically valuable at lower temperatures. If such electrically conductive means and methods were available, the electrical junction and union between the electrical circuits and instruments of our everyday world could then be linked and employed in combination with the minimal electrical resistance of circuits provided by superconductors generally. Such effective means and methodology for electrical juncture, however, have as yet been unavailable in this art.

SUMMARY OF THE INVENTION

The present invention provides a method for making an electrically conductive contact of reduced resistance useful for electrical juncture of a superconductive material, said method comprising the steps of:

obtaining a noble metal in fragmented form;

applying said noble metal fragments as a preliminary external coating to a chosen area on the surface of a high transition temperature superconductive material;

heating said preliminary external coating of noble metal fragments and said chosen area of said superconductive material to a temperature greater than the softening-point temperature and less than the melting-point temperature of said noble metal whereby said heated noble metal fragments of said preliminary external coating penetrate and become embedded within said high transition temperature superconductive material;

allowing said embedded noble metal fragments within said superconductive material to cool and solidify;

adding additional noble metal fragments as a final external coating over said chosen area of superconductive material;

warming said final external coating of noble metal fragments and said chosen area of superconductive material to a temperature greater than the softening-point temperature and less than the melting-point temperature of said noble metal whereby said warmed noble metal fragments of said final external coating form a unified mass of noble metal externally on the surface of said high transition temperature superconductive material, said external unified mass being in electrical communication with said embedded noble metal with said superconductive material; and cooling said external unified mass of noble metal to form a solid electrically conductive contact on the surface of said high transition temperature superconductive material.

BRIEF DESCRIPTION OF THE FIGURES

The present invention can be more easily and completely understood when taken in conjunction with the accompanying drawing, in which:

FIG. 1 is a photograph illustrating a 1000X magnification and cross-sectional view of a YBCO rod with a conductive contact made using the present invention;

FIG. 2 is a photograph illustrating a 1000X magnification and cross-sectional view of a YBCO rod with a electrical pad made using the silver print method of the prior art.

DETAILED DESCRIPTION OF THE PRESENT INVENTION

Figure 3:
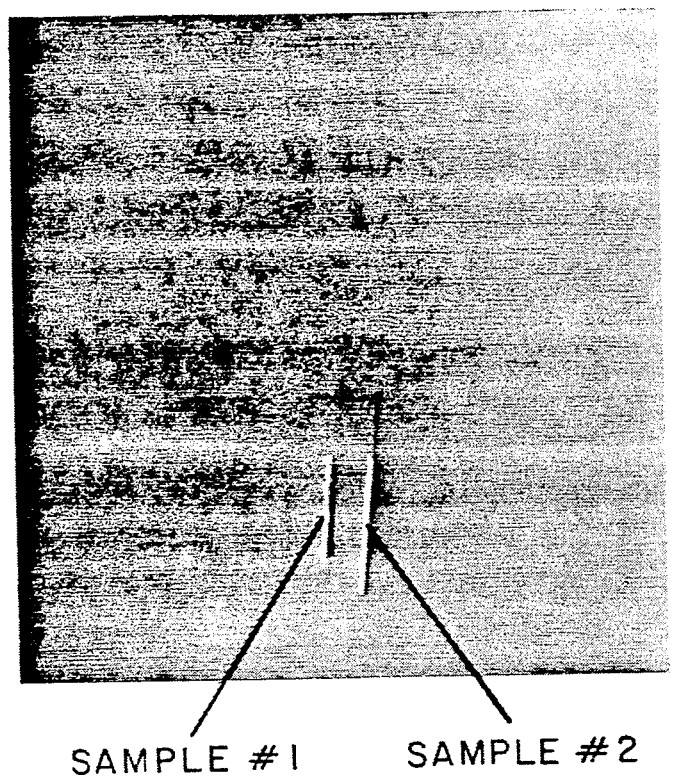
FIG. 3 is a photograph of two YBCO rods illustrating the consequences of failing to keep the warming temperature of silver below 920° C. when practicing the methodology of the present invention.

The present invention is a method for making a conductive contact useful for electrical juncture of a superconductive material to itself, to a semi-conductor, or to a normal conductor. The formed conductive contact serves as a point of union and as an electrical connector for the high transition temperature superconductive material. The steps comprising the methodology and the resulting conductive contact are singular and unique in this art; and provide major advantages and unusual benefits to the user when designing and fabricating electrical circuits which employ high $T_c$ superconductors. Some of these advantages and benefits include the following:

1. Any high $T_c$ superconductive material may be employed with the methodology to form electrically conductive contacts. The methodology and the resulting conductive contact may be employed with any shape, dimension, thickness, orientation, configuration, or formulation of superconductive materials without limitation or restriction. Accordingly, so long as the material is demonstrably a high $T_c$ superconductor by definition, the present methodology may be usefully employed to form an electrically conductive contact at a chosen site or location on the superconductive material.

2. Unlike conventionally known methods and techniques for electrically joining superconductors, the present methodology may be employed and practiced to deposit an electrically conductive contact on the surface of the superconductive material either before or after annealing with oxygen. Thus, regardless of the formulation or structure of the material, the conductive contact may be formed prior to any annealing without subsequent loss of superconducting properties; or the conductive contact may be deposited upon the previously annealed material and the material subsequently annealed in oxygen again to yield the superconductive material in conformity with conventional practice. It is desirable or advantageous to the user, however, that only one annealing step be employed, a condition completely unlike conventionally known requirements.

3. The present methodology has no need for and no requirement of the vacuum vapor deposition equipment or vacuum techniques whatsoever. Unlike prior art methods and techniques, there are no meaningful apparatus requirements and no vacuum conditions needed or desired in order to practice the present invention. Moreover, because no vacuum equipment is used, there is no limitation on the size or dimensions of the superconductor which is to be provided with an electrical contact. Thus, not only is a more rapid methodology provided by the present invention, there is a major reduction of capital investment, equipment, and tedium as well.

4. The present methodology and the resulting electrically conductive contact provide a minimal electrical resistance for the union and junction of the superconductive material. A typical resistance provided by the formed conductive contact is less than $10^{-7}$ ohms/cm$^2$, a markedly reduced electrical resistance value. This decreased electrical resistance, as well as the tensile strength provided by the conductive contact, is directly due to the methodology employed in forming the contact on the surface of the superconductive material.

5. The present methodology is very simple to implement and use; and may be performed by relatively unskilled persons in any laboratory or production/manufacturing setting. A minimum of materials are required; and only a minimum of care is needed to insure that a conductive contact is formed which provides the desired minimum electrical resistance.

I. The Superconductive Materials

As regards the superconductive materials which may be usefully employed using the present methodology to form an electrically conductive contact, a wide range of different substances including refractory oxide compositions, metallic alloys, and atomic elements have recognized properties which identify them as superconductive compositions. A representative, but incomplete, listing is provided by Table 1 below. Most preferred and most useful, however, are the high transition temperature superconductors. It should also be recognized that some of the materials listed in Table 1 may be unsuitable for this procedure.

TABLE 1

| Superconductive Composition | Name | $T_c$ (range, K) | Published Reference |
|---|---|---|---|
| Refractory oxide ceramics | yttrium barium copper oxides ($YBa_2Cu_3O_{7-x}$) BiSrCaCuO | up to 93 | ^ |
| | TlBaCaCuo La-Sr-CuO | up to 110 | # |
| Alloys | $Nb_3Al_{0.8}Ge_{0.2}$ | 20.1 | * |
| | $Nb_3Sn$ | 18.1 | * |
| | $Nb_3Al$ | 17.5 | * |
| | $Nb_3Au$ | 11.5 | * |
| | $Nb_3N$ | 16.0 | * |
| | MON | 12.0 | * |
| | $V_3Ga$ | 16.5 | * |
| Elements | Al | 1.2 | * |
| | Cd | 0.5 | * |
| | Ga | 1.1 | * |
| | In | 0.1 | * |
| | La( ) | 4.8 | * |
| | La( ) | 4.9 | * |
| | Pb | 7.2 | * |
| | Hg( ) | 4.2 | * |
| | Hg( ) | 4.0 | * |
| | Mo | 0.9 | * |
| | Nb | 9.3 | * |
| | Os | 0.7 | * |
| | Rh | 1.7 | * |
| | Ru | 0.5 | * |
| | Ta | 4.5 | * |
| | Tc | 8.2 | * |
| | Tl | 2.4 | * |
| | Th | 1.4 | * |
| | Sn | 3.7 | * |
| | Ti | 0.4 | * |
| | W | 0.01 | * |
| | U( ) | 0.6 | * |
| | U( ) | 1.8 | * |
| | V | 5.3 | * |
| | Zn | 0.9 | * |
| | Zr | 0.8 | * |

*M. A. Omar, Elementary Solid State Physics: Principles and Applications, 1975, p 499.
^ Wu et al., Phys. Rev. Lett. 58:905 (1987).
Chu et al., Phys. Rev. Lett. 60:941 (1988); and Dai et al., Intern. J. Mod. Phys. B3:77 (1989).

It will be recognized and appreciated, however, that certain kinds of refractory ceramic oxides have been developed in recent years which constitute "high transition temperature" superconductors; and that these are most desirable as the materials when using the present invention. The utilization and deployment of high transition temperature superconductors in current applications will depend in major degree upon the electrical interface resistance of the superconductive materials of the high $T_c$ superconductive materials with each other, with other superconductors, and with normal or semiconductive metals and materials. It is expected and presumed that all conventionally available knowledge and effort will be employed to minimize and reduce electrical resistance in addition to the manufacture and use of the present conductive contacts.

II. The Substances Employed for Making Conductive Contacts Using the Present Methodology The substances employed within the present methodology for making electrically conductive contacts are those atomic elements which are Noble Metals as a family; and comprise the metals of silver, gold, and platinum as the membership. Noble metals do not deteriorate the superconductive properties of high transition temperature materials; are durable; and are excellent conductors of electrical current. Within the membership of this family, silver is most preferred due to its minimal costs and lower softening temperature in comparison to gold or platinum.

The Noble metals are employed within the present methodology in minutely subdivided or fragmented form. The precise type and nature of the fragments are immaterial and thus include flakes, chips, particles, powders, or any other minute subdivision of these metals. It is highly desirable, but optional with the user, that all the fragments be relatively uniform or consistent in size, shape, or configuration. It is also most desirable that the fragments be in the range from about 1-50 microns in dimension, with the 10 micron size being preferred. Such small sizes of Noble metal fragments will provide a powder, a dust, or a particulate flaked mass which is easily handled and employed; and may be layered, spread, and deposited as a coating on the external surface of a superconductive material with relative ease and with little or no equipment as such.

It will be noted and appreciated that each member of the Noble metal family individually has a characteristic and unique softening-point temperature as well as a melting-point temperature. It is essential to recognize the difference in properties and characteristics of each Noble metal when warmed to its softening-point temperature in comparison to its attributes when heated to its individual melting-point temperature. When a Noble metal is warmed to its softening-point temperature, the individual fragments of metal become pliable, malleable, mobile, and miscible. There is no liquification as such, however, at the softening-point temperature.

Moreover, Noble metal fragments warmed to their softening-point temperatures may be employed in a unique phenomenon and process known as sintering—which, by definition, allows the individual metal fragments to coalesce into a single mass without actually liquifying the metal. Conversely, heating the Noble metal to its individual melting point temperature causes an outright liquification of the metal and a major change of physical properties into a free flowing liquid. It will be noted and appreciated that a Noble metal heated to its melting point temperature (or greater temperature) loses the capability of being sintered as such; and that there is no correspondence between the characteristics and attributes of liquified Noble metals in comparison to Noble metals which have been warmed only to its softening-point temperature and thus may be sintered to achieve one or more results or consequences. It is conventionally well recognized and demonstrated that Noble metals which have been melted or liquified do not provide properties, characteristics, or capabilities similar to Noble metals which have been merely softened and sintered. A representative listing of the softening-point temperature and the melting point temperature for each Noble metal is provided by Table 2 below.

TABLE 2

| Nobel Metal | Softening-Point Temperature | Melting-Point Temperature |
|---|---|---|
| Silver | 900° C. | 960° C. |
| Gold | 950° C. | 1,062° C. |
| Platinum | 1,500° C. | 1,755° C. |

III. Preferred Protocol and Procedural Steps

The preferred protocol and procedure employs finely divided silver fragments as the preferred Noble metal and preferably utilizes a high transistion temperature superconductive material as the workpiece upon which the electrically conductive contact is to be formed. The preferred manipulative steps are as follows.

Step 1: Clean the external surface of the superconductive material if it has not been freshly manufactured. This cleaning may be performed by rubbing fine (#16) Emery paper against the external surface of the superconductive material to remove a very thin layer of matter from the external surface and to create a freshly exposed chosen area service for subsequent coating with the fragmented silver.

Step 2: Wearing a plastic or rubber glove (or by utilizing any other suitable article), apply a first or preliminary coating of silver fragments to the chosen area on the external surface of the superconductive material which is to receive the conductive contact. The preliminary coating of silver fragments, preferably silver flakes sized to 10 microns, are desirably uniformly deposited over the entire chosen area. The fragment covered external surface of the superconductor will then appear very light gray in color as a consequence of being coated with these silver fragments.

Step 3: Using localized and preferably indirect heat source (such as from a torch with a constant temperature or a laser or any other radiation source), start to warm the preliminary silver coating on the external surface of the superconductive material. The heating temperature should be carefully adjusted and controlled such that the temperature of the underlying superconductive material does not approach 900° C. and that the preliminary external coating of silver fragments become heated only to the softening-point temperature (about 850° C.) of the silver. Should another Noble metal be employed in fragmented form as the preliminary external coating, the temperature should also be carefully controlled to avoid decomposing the superconductive material; and to reach only the softening-point temperature and avoid the melting point temperature for that Noble metal.

Step 4: Keep the flame of the torch (or other heat source) indirectly on the silver coating at the correct temperature, preferably at 850° C. for about 20 seconds duration. The softened silver fragments of this first external coating will begin to migrate and move away from the external surface of the superconductive material; and then penetrate the thickness and substance of the superconductive material internally. Note that softened silver fragments will occupy and internally fill the void spaces existing between the grains of superconductor—that is, the softened silver fragments will tangibly sink between and become embedded within the grains of superconductive material itself as a consequence of being softened. If one takes the heating source away from the external surface of the chosen area of the superconductor, one can see that the softened silver fragments in the coating have migrated internally; and that the color of the external surface has changed from black to dark gray due to the presence of the silver fragments which are now embedded internally between the grains of the superconductors.

The heating temperature is preferably controlled and for silver is maintained between 870° C.–900° C. One should take care never to approach, much less exceed, the melting point temperature (960° C.) of silver. The danger in overheating and exceeding the desired temperature range is that as the temperature approaches 960° C., the silver fragments of the preliminary external coating will quickly melt and form a metallic liquid silver droplet. Once molten silver is formed at or above 960° C., the molten silver cannot penetrate, migrate, become internalized, or become embedded between the grains of the superconductive material due to its liquified state and its larger liquid volume. Thus, all safeguards and controls as are possible should be taken and maintained that the heating temperature for the silver fragments of the coating never approach, much less exceed, the 960° C. temperature. There is also a danger of melting the high $T_c$ superconductor which may destroy its superconducting properties.

Step 5: If a deeper diffusion and multiple penetration of silver (or other Noble metal) into the thickness and substance of the superconductive material is desired or required by the user, steps 2, 3, and 4 may be repeated in sequence for an additional one or more cycles. This increased diffusion of Noble metal fragments into the midst of the superconductive material is completely optional. Nevertheless, in the majority of use circumstances envisioned, it is highly desirable to repeat the cycle of preliminary coating and heating the Noble metal fragments to their softening-point temperature because the critical current density is increased by the presence of additional silver embedded within the grains of superconductor. In each instance of cyclic repetition, however, it should be noted that the heating temperature should not approach or exceed the melting point temperature value of the Noble metal in order to provide the softening migration, penetration, and embedding of the metal fragments between the grains of superconductive material internally.

Step 6: Ultimately, a final external coating of fragmented silver (or other Noble metal) is applied to the chosen area on the external surface of the superconductive material following the manipulation and/or apparatus described within step 2. It is desirable that this final coating of silver fragments be substantially greater in quantity and thus provide a thicker continuous coating of silver over the previously heated chosen area—in order that a uniform externalized contact be formed.

Step 7: This final coating of silver fragments is heated to at least the softening-point temperature for the Noble metal fragments; but this warming will not approach or exceed the melting point temperature of 960° C. This final coating of silver fragments will be carefully sintered on the external surface thereby coalescing the individual fragments into a single unified mass under the influence of heat, without ever actually liquifying the metal fragments themselves. By controlling the heating source such that the softening heat is directed mainly at the final external coating for only a few seconds without allowing the temperature of the embedded silver within the superconductor to rise in similar or identical degree, the softened fragments comprising the final coating layer will self-adhere and become attached to the external surface of the superconductive material thereby forming a metalized pad and discrete layer on the exterior of the superconductive material. It is essential and critical, therefore, to carefully control the warming temperature; and to take adequate measures to ensure and control the amount of heat applied to this final coating of silver fragments such that it does not approach or exceed the 960° C. value.

The consequence of warming this final coating is the formation of a discrete metallic silver layer on the external surface of the superconductive material. This final silver layer is joined to and in electrical communication with the embedded silver fragments within the thickness of the superconductor itself. However, by forming a unified and discrete silver layer on the external surface, this final coating forms a discrete electrical connection and junction surface which is adhered to the external surface of the superconductor itself.

Step 8: The unified mass or layer of silver is allowed to cool and form a solid, electrically conductive contact on the surface of the superconductive material. Once solidified, the conductive contact may be employed to advantage to join other superconductors, semiconductors, or normal conductors to the superconductive material using this discrete conductive contact as both the point of physical and electrical union.

Step 9: To restore the superconducting properties of the material (which may have been instituted before but were lost due to heating), the superconductive material with the resulting conductive contact on its surface is annealed using conventionally known procedures. The preferred annealing process places the material in molecular oxygen at 500° C. for 48 hours, followed by slow cooling in the presence of flowing molecular oxygen until room temperature (20° C.) is achieved. During the annealing process, the high $T_c$ superconductor regains its characteristic superconductive properties.

IV. Evidence Demonstrating the Utility of the Methodology and the Resulting Conductive Contact The above-described protocol and preferred procedure was employed using 10 micron silver fragments as the preliminary and final coatings; and a YBCO superconductive rod upon which to form a conductive contact. The YBCO rod was placed upon a fire brick and preliminarily coated over a chosen area of its external surface with the fragmented silver. Heat from a torch was localized and indirectly applied to the fragmented silver coating to provide a temperature of approximately 900° C. for about 10 seconds duration. The silver fragments of the preliminary coating began to migrate away from the external surface of the YBCO rod and were seen to penetrate the interior of the superconductor. As the heat was removed from the silver coating on the external surface, the color of the surface superconductive material had changed from black to gray.

An optical examination shows that the softened silver fragments of the preliminary coating in fact penetrated the thickness of the YBCO superconductor and became embedded within the grains of the YBCO itself. Moreover, heating the second or final external coating of silver fragments provided a solified metallic silver mass which is in electrical communication with the internalized silver embedded within the grains of YBCO.

Visual evidence of this result is provided by FIGS. 1 and 2 respectively, which are photographs showing cross-sectional views of YBCO rods and the external conductive contacts on each rod surface constructed using different methods of manufacture. FIG. 1 shows the electrical contact area at 1000× magnification as prepared using the methodology of the present invention. In comparison, FIG. 2 shows the electrical contact area of a YBCO rod at 1000× magnification prepared using the silver print method conventionally known and used in this art.

It is noteworthy that FIG. 1 reveals a silver contact pad (at 1000× magnification) in which two different regions, A and B, are clearly recognisable. Region A is the outer region and represents the silver contact while region B is the interior region of the rod and shows the grains of YBCO. It will be recognised and appreciated that the silver has diffused into and become embedded within the YBCO rod interior as seen by the silver grains and the ragged edge of the silver/YBCO interface. In comparison, FIG. 2 shows a silver contact pad (at 1000× magnification) made using the silver print method and also reveals two distinct regions, C and D. Region C is the outer region and reveals the silver pad as a sharp edged layer while region D is the interior of the rod and shows the grains of YBCO. Note that the edges of the silver pad are smooth at the silver/YBCO interface. Moreover, there is no evidence or showing that the silver diffused into the interior of the YBCO rod and clearly is not present or embedded within the grains of YBCO. The silver pad of FIG. 2 constructed using the silver print method is thus in poor electrical contact with the YBCO rod; and, because of the smooth edged and sharply delineated silver pad surface, the electrical contact resistance of the silver print pad is much higher than the electrical contact resistance of the silver contact of FIG. 1 prepared using the present invention.

It is also noteworthy to recognise the effect of failing to control the heating or warming temperature when performing any of the steps comprising the present methodology. Should the user fail to keep the heating temperature of the silver below 920° C., the user will fail to achieve a meaningful and successful result. Such a failure is illustrated by FIG. 3.

FIG. 3 is a photograph showing two YBCO rods as different samples, #1 and #2. Sample #1 shows an absence of a smooth external layer of silver on the external surface of the YBCO rod; and instead reveals a set of small irregularly shaped blobs of silver on the external surface. This undesirable result is the consequence of heating the silver fragments above 920° C. Such excessive heating of the silver causes a complete loss of smooth electrical contact formation and an absence of silver penetration, migration or embedement internally within the YBCO rod. In comparison, sample #2 shows the desired and proper result obtained when the silver is warmed only to temperatures well below 920° C. An evenly distributed layer of silver is formed on the exterior surface of the YBCO rod and provides a smooth electrical contact of minimal electrical resistance.

The present invention is not to be restricted in form nor limited in scope except by the claims appended hereto.

What we claim is:

1. A method for making an electrically conductive contact for electrical juncture of a high $T_c$ superconductive material, said method comprising the steps of:

obtaining a noble metal in fragmented form;

applying said noble metal fragments as a preliminary external coating of an area on the surface of a high $T_c$ superconductive material;

heating said preliminary external coating of noble metal fragments and said area of said superconductive material to a temperature greater than the softening-point temperature and less than the melting point temperature of said noble metal whereby said heated noble metal fragments of said preliminary external coating penetrate and become embedded within said superconductive material;

allowing said embedded noble metal fragments within said superconductive material to cool and solidify;

adding additional noble metal fragments as a final external coating over said area of said superconductive material;

warming said final external coating of noble metal fragments and said area of said superconductive material to a temperature greater than the softening-point temperature and less than the melting point temperature of said noble metal whereby said warmed noble metal fragments of said final external coating form a unified mass of noble metal externally on the surface of said superconductive material, said external unified mass being in electrical contact with said embedded noble metal within said superconductive material; and cooling said external unified mass of noble metal to form a solid electrically conductive contact on the surface of said superconductive material.

2. The method as recited in claim 1 wherein said noble metal is selected from the group consisting of silver, gold, and platinum.

3. The method as recited in claim 1 wherein a plurality of said preliminary coatings are applied and heated on the surface of said superconductive material prior to adding said final external coating.

* * * * *